(12) United States Patent
Ogata et al.

(10) Patent No.: US 8,162,231 B2
(45) Date of Patent: Apr. 24, 2012

(54) NONCONTACT IC TAG LABEL AND METHOD OF MANUFACTURING THE SAME

(75) Inventors: Tetsuji Ogata, Itabashi-Ku (JP); Hideto Sakata, Akishima (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 460 days.

(21) Appl. No.: 12/447,986

(22) PCT Filed: Oct. 16, 2007

(86) PCT No.: PCT/JP2007/070143
§ 371 (c)(1),
(2), (4) Date: Apr. 30, 2009

(87) PCT Pub. No.: WO2008/053702
PCT Pub. Date: May 8, 2008

(65) Prior Publication Data
US 2010/0051701 A1    Mar. 4, 2010

(30) Foreign Application Priority Data
Nov. 1, 2006  (JP) ................................. 2006-297252

(51) Int. Cl.
*G06K 19/06* (2006.01)
(52) U.S. Cl. ........................................ 235/492; 235/380
(58) Field of Classification Search .................. 235/492, 235/381, 487, 380, 451
See application file for complete search history.

(56) References Cited

U.S. PATENT DOCUMENTS

| | | | |
|---|---|---|---|
| 6,383,616 B1 | 5/2002 | Uchibori | |
| 7,404,522 B2 | 7/2008 | Kawai | |
| 2004/0169086 A1* | 9/2004 | Ohta et al. | 235/492 |
| 2006/0131426 A1* | 6/2006 | Ishikawa et al. | 235/492 |
| 2007/0214637 A1 | 9/2007 | Nakanishi et al. | |
| 2008/0117049 A1* | 5/2008 | Ogata et al. | 340/572.1 |

FOREIGN PATENT DOCUMENTS

| | | |
|---|---|---|
| JP | 09-044762 A1 | 2/1997 |
| JP | 2003-308510 A1 | 10/2003 |
| JP | 2005-339518 A1 | 12/2005 |
| JP | 2005-346696 A1 | 12/2005 |
| JP | 2006-146786 A1 | 6/2006 |
| JP | 2006-277700 A1 | 10/2006 |
| WO | 2004/104912 A1 | 12/2004 |

* cited by examiner

*Primary Examiner* — Edwyn Labaze
(74) *Attorney, Agent, or Firm* — Burr & Brown

(57) ABSTRACT

This invention provides a thin type of noncontact IC tag label that allows materials costs to be reduced without using an antenna-supporting base film. The noncontact IC tag label includes an electroconductive layer of a required antenna pattern shape, an IC chip mounted on one face of the electroconductive layer, and a surface protection sheet supporting the electroconductive layer and the IC chip from a side of the one face of the electroconductive layer via a first pressure-sensitive adhesive layer. An adhesive resin layer having the same shape as the antenna pattern shape of the electroconductive layer is provided on the other face of the electroconductive layer. The adhesive resin layer is temporarily bonded in separable manner onto a release paper formed from paper or a plastic base material.

17 Claims, 8 Drawing Sheets

NONCONTACT IC TAG LABEL AND METHOD OF MANUFACTURING THE SAME

CROSS-REFERENCE TO RELATED APPLICATIONS

The present patent application benefits from Japanese application serial number JP2006-297252, filed on Nov. 1, 2006. The entire disclosure of this earlier application is hereby incorporated by reference in this application.

FIELD OF THE INVENTION

The present invention relates generally to noncontact IC tag labels and methods of manufacturing the same. More particularly, the invention concerns a noncontact IC tag label constructed without a base material, unlike conventional noncontact IC tag labels, and including an antenna pattern supported by a surface protection sheet. In addition, the invention is directed to a method of manufacturing the above noncontact IC tag label.

BACKGROUND OF THE INVENTION

Noncontact IC tag labels are a medium that is also termed a radio-frequency identification (RFID) tag or a noncontact data carrier. This type of medium has an IC chip retaining the information allowing the identification of a specific commodity/product, animal, or person, and is constructed to allow noncontact reading of the information by means of radio communications. These noncontact IC tag labels are used in such fields as transport, physical distribution, warehousing, factory process control, and cargo handling.

The confirmation of the advantages and applicability of the noncontact IC tags is progressing, but among the causes of the hindrance to more widespread use of these noncontact IC tags is the problem that the tags themselves are expensive. For use in larger quantities, therefore, it is important for these tags to be further reduced in cost. Cost reduction of the integrated circuits and base materials required, however, is currently at its limits and thus, remarkable lower pricing of the tags is not anticipated for the nonce. For example, the IC tags used for products are manufactured primarily by forming a resist pattern on an aluminum, copper, or any other metallic layer stacked upon a base material and having an antenna or electroconductive member for a noncontact IC tag label, and then etching the patterned region. These IC tags, however, are required to be constructed to have a simpler structure and at the same time, manufactured in a simpler manner.

Patent Document 1 proposes a method of forming directly an antenna using a punching edge. However, as the invention disclosed in Patent Document 1 is entitled "Electrically Conductive Member for Noncontact Data Carrier, and Method for Manufacturing the Member", Patent Document 1 does not relate to manufacturing the noncontact IC tag label itself. In addition, although the noncontact data carrier itself is described in claims 3 and 4, a surface protection sheet with a pressure-sensitive adhesive layer is not described and the construction of the noncontact data carrier differs from that of the noncontact IC tag described in the present application.

A method of manufacturing a resonance tag by punching is also described in Patent Document 2. The resonance tag construction described in Patent Document 2, however, differs from the IC tag construction described in the present application.

Patent Document 1: JP-A-2005-346696
Patent Document 2: JP-A-H09-44762

SUMMARY OF THE INVENTION

Conventional noncontact IC tag labels have had the problem that their structure absolutely requiring the use of the base film for supporting the antenna from the underside increases the cost of the data carrier. Also, conventional manufacturing methods have had the problem that in addition to the use of resist-forming process equipment and etching equipment for resist printing and photomasking, etching requires post-processing and the preparation of independent patterns for each of individual products, thus causing the maximum achievable production capabilities to be reached, and increasing materials costs and manufacturing costs.

There is also a need to prevent unauthorized reuse of the noncontact IC tag label, such as detaching the noncontact IC tag label from an authorized or authenticate product to which the label has already been attached, and then attaching the detached label to a counterfeit or fake product to feign this product as if it were an authorized or authenticate one. For this reason, it is desirable that noncontact IC tag labels be designed so as to fail if detached from the respective products by force. However, since conventional noncontact IC tag labels have an antenna and a chip on a base film formed from polyethylene terephthalate, polyethylene naphthalate, polyimide, and/or the like, it is difficult to make these IC tag labels fail if detached by force.

Patent Document 1 only describes a method of manufacturing an electroconductive member for a noncontact IC tag label and does not propose a succession of consistent steps from mounting an IC chip to stacking a surface protection sheet fitted with a pressure-sensitive adhesive layer, over the IC chip, and punching the surface protection sheet into label form. Accordingly, the present applicant researched a lower-cost noncontact IC tag label and its manufacturing method to complete the present invention.

The present invention provides, as an aspect thereof, a noncontact IC tag label comprising: an electroconductive layer having a required antenna pattern shape; an IC chip mounted on one face of the electroconductive layer; a surface protection sheet for supporting the electroconductive layer and the IC chip from a side, on which the IC chip is mounted, of the electroconductive layer via a first pressure-sensitive adhesive layer; an adhesive resin layer provided on the other face of the electroconductive layer and having the same shape as the antenna pattern shape thereof, the adhesive resin layer being temporarily bonded in a releasable fashion onto a release paper formed from paper or a plastic base material.

In the above noncontact IC tag label, the adhesive resin layer can be made either a thermo adhesive resin layer or a pressure-sensitive adhesive layer. Alternatively, using heat-sensitive color-developing paper as the surface protection sheet is preferable since direct printing on the paper becomes possible. In addition, the antenna pattern may be made applicable in various forms such as a spiral type, a dipole type, or a patch type.

In addition, in the above noncontact IC tag label, pressure-sensitive adhesive strength of the pressure-sensitive adhesive layer is preferably weaker than that of the adhesive resin layer with respect to an object onto which the noncontact IC tag label is to be bonded. The object onto which the noncontact IC tag label is to be bonded is preferably formed from wood, paper, a metal, or a plastic.

Furthermore, in the above noncontact IC tag label, the IC chip may be mounted on one face side of the electroconductive layer via an electroconductive pattern layer.

The present invention provides, as another aspect thereof, a method of manufacturing a noncontact IC tag label, the method comprising the steps of: setting up into position a release paper formed from paper or a plastic base material and having a release surface; bringing an antenna material inclusive of an electroconductive layer and a thermo adhesive resin layer into firm contact with the release surface of the release paper with the thermo adhesive resin layer oriented towards the release surface; temporarily bonding the electroconductive layer and thermo adhesive resin layer of the antenna material onto the release surface, by firstly die-cutting the electroconductive layer and the thermo adhesive resin layer into a shape of an antenna pattern, from a side the electroconductive layer is disposed down to the release surface, by use of an antenna-cutting die having a heat source, and then fusing the thermo adhesive resin layer; removing sections other than the antenna pattern of the die-cut antenna material; mounting an IC chip at a required position on the antenna pattern; stacking a surface protection sheet over the IC chip via a first pressure-sensitive adhesive layer; and die-cutting the surface protection sheet and the first pressure-sensitive adhesive layer into an outline shape of the noncontact IC tag label by use of a label-cutting die.

The present invention provides, as yet another aspect thereof, a method of manufacturing a noncontact IC tag label, the method comprising the steps of: setting up into position a release paper formed from paper or a plastic base material and having a release surface; bonding an antenna material inclusive of an electroconductive layer and a second pressure-sensitive adhesive layer onto the release surface of the release paper with the second pressure-sensitive adhesive layer oriented towards the release surface; die-cutting the electroconductive layer and second pressure-sensitive adhesive layer of the antenna material into a shape of an antenna pattern, from a side the electroconductive layer is disposed down to the release surface, by use of an antenna-cutting die; removing sections other than the antenna pattern of the die-cut antenna material; mounting an IC chip at a required position on the antenna pattern; stacking a surface protection sheet over the IC chip via a first pressure-sensitive adhesive layer; and die-cutting the surface protection sheet and the first pressure-sensitive adhesive layer into an outline shape of the noncontact IC tag label by use of a label-cutting die.

In the above method of manufacturing a noncontact IC tag label, the antenna pattern may be made applicable in various forms such as a spiral type, a dipole type, or a patch type.

Additionally, in the above method of manufacturing a noncontact IC tag label, pressure-sensitive adhesive strength of the first pressure-sensitive adhesive layer is preferably weaker than that of the thermo adhesive resin layer with respect to an object onto which the noncontact IC tag label is to be bonded. Otherwise, pressure-sensitive adhesive strength of the first pressure-sensitive adhesive layer is preferably weaker than that of the second pressure-sensitive adhesive layer with respect to the object onto which the noncontact IC tag label is to be bonded.

The present invention provides, as a further aspect thereof, a method of manufacturing a noncontact IC tag label, the method comprising the steps of: setting up into position a release paper formed from paper or a plastic base material and having a release surface; bringing an antenna material inclusive of an electroconductive layer and a thermo adhesive resin layer into firm contact with the release surface of the release paper with the thermo adhesive resin layer oriented towards the release surface; temporarily bonding the electroconductive layer and thermo adhesive resin layer of the antenna material onto the release surface, by firstly die-cutting the electroconductive layer and the thermo adhesive resin layer into a shape of an antenna pattern, from a side the electroconductive layer is disposed down to the release surface, by use of an antenna-cutting die having a heat source, and then fusing the thermo adhesive resin layer; removing sections other than the antenna pattern of the die-cut antenna material; connecting an electroconductive layer including an IC chip previously mounted thereon and formed upon a surface protection sheet via a first pressure-sensitive adhesive layer, to an upper face of the antenna pattern; and die-cutting the surface protection sheet and the first pressure-sensitive adhesive layer into an outline shape of the noncontact IC tag label by use of a label-cutting die.

The present invention provides, as a further aspect thereof, a method of manufacturing a noncontact IC tag label, the method comprising the steps of: setting up into position a release paper formed from paper or a plastic base material and having a release surface; bonding an antenna material inclusive of an electroconductive layer and a second pressure-sensitive adhesive layer onto the release surface of the release paper with the second pressure-sensitive adhesive layer oriented towards the release surface; die-cutting the electroconductive layer and second pressure-sensitive adhesive layer of the antenna material into a shape of an antenna pattern, from a side the electroconductive layer is disposed down to the release surface, by use of an antenna-cutting die; removing sections other than the antenna pattern of the die-cut antenna material; connecting an electroconductive layer including an IC chip previously mounted thereon and formed upon a surface protection sheet via a first pressure-sensitive adhesive layer, to an upper face of the antenna pattern; and die-cutting the surface protection sheet and the first pressure-sensitive adhesive layer into an outline shape of the noncontact IC tag label by use of a label-cutting die.

In the above method of manufacturing a noncontact IC tag label, a thermoplastic pressure-sensitive adhesive resin layer is provided on the electroconductive layer, and the step of connecting the electroconductive pattern layer to the upper face of the antenna pattern may include the substep of attaching the electroconductive pattern layer to the upper face of the antenna pattern via the thermoplastic pressure-sensitive adhesive resin layer, and the substep of interconnecting the electroconductive pattern layer and the antenna pattern by using a thermal staking method, an ultrasonic connecting method, a thermocompression bonding method, or a stapler fastening method independently or in combination.

(1) According to the noncontact IC tag label of the present invention, materials costs can be reduced since the label does not use the antenna-supporting base film that has been a mandatory structural material of a conventional noncontact IC tag label.

(2) In the noncontact IC tag label manufacturing method of the present invention, manufacturing costs can be reduced since the label can be completed by die cutting with an antenna-cutting die, without using a conventional etching method.

(3) In addition, in the noncontact IC tag label manufacturing method of the present invention, pressure-sensitive adhesive strength of the first pressure-sensitive adhesive layer is weaker than that of the adhesive resin layers (thermo adhesive resin layer and the second pressure-sensitive adhesive layer) with respect to an object onto which the noncontact IC tag label is to be bonded. Therefore, the noncontact IC tag label will fail if detached from the particular object by force. This prevents a counterfeit or a fake product from being feigned as if it is an authorized or authenticated one, even if the noncontact IC tag label detached from the particular object is attached to that.

DETAILED DESCRIPTION OF THE INVENTION

Hereunder, embodiments of the present invention will be described in further detail referring to the accompanying drawings.

Figure 1:
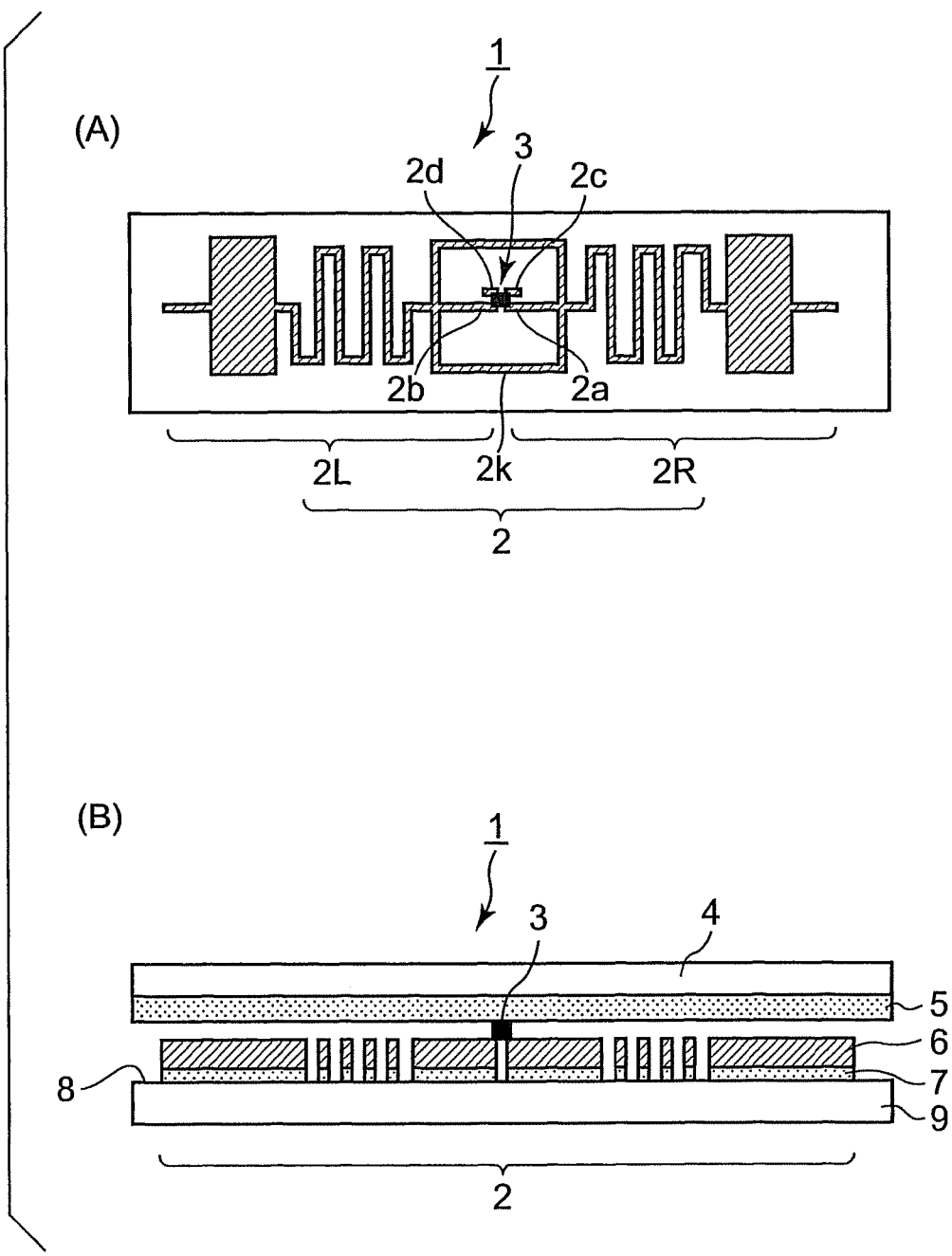
FIG. 1 is a diagram showing a noncontact IC tag label of the present invention.
Figure 2:
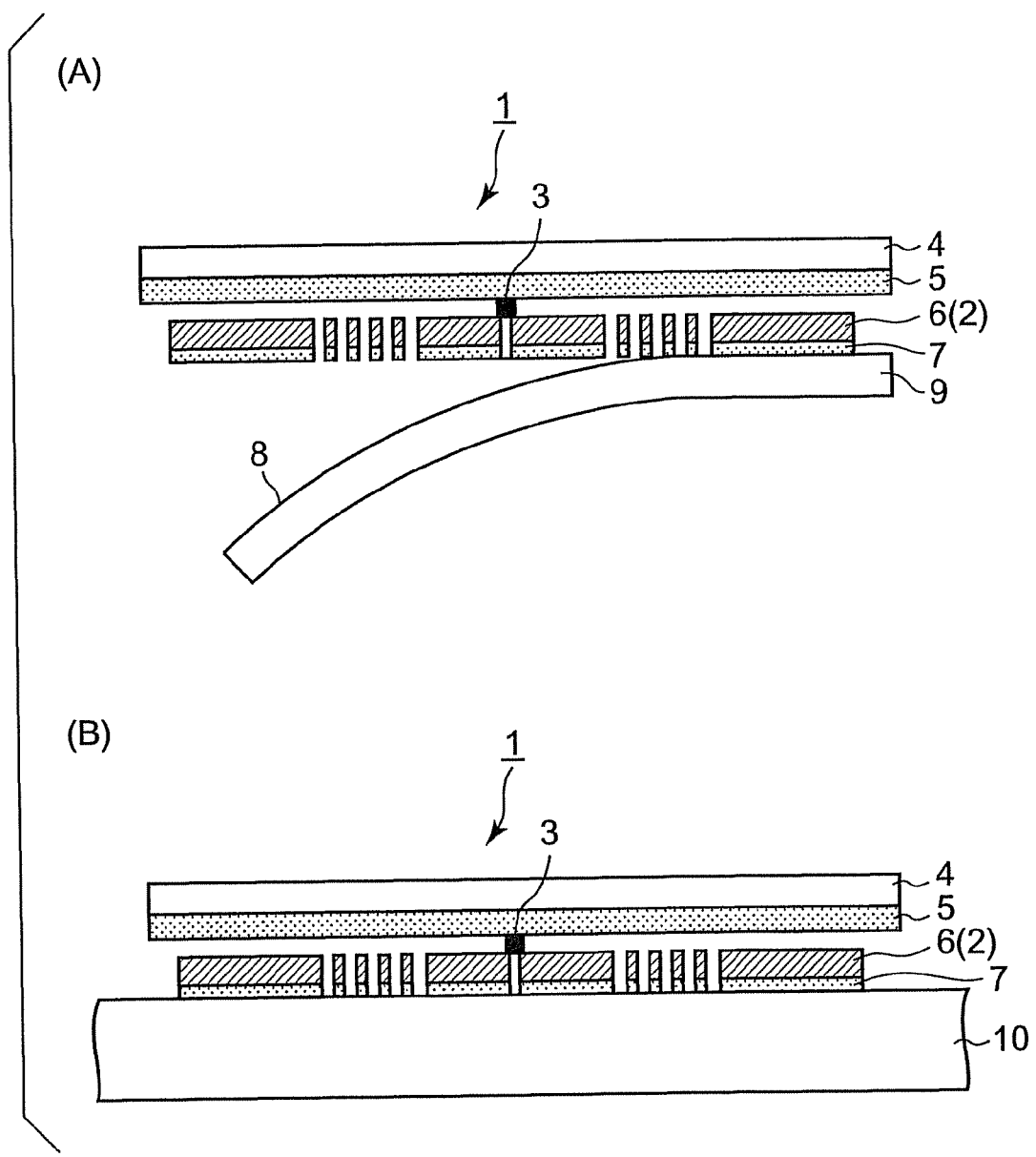
FIG. 2 is a diagram illustrating a method of using the noncontact IC tag label.
Figure 3:
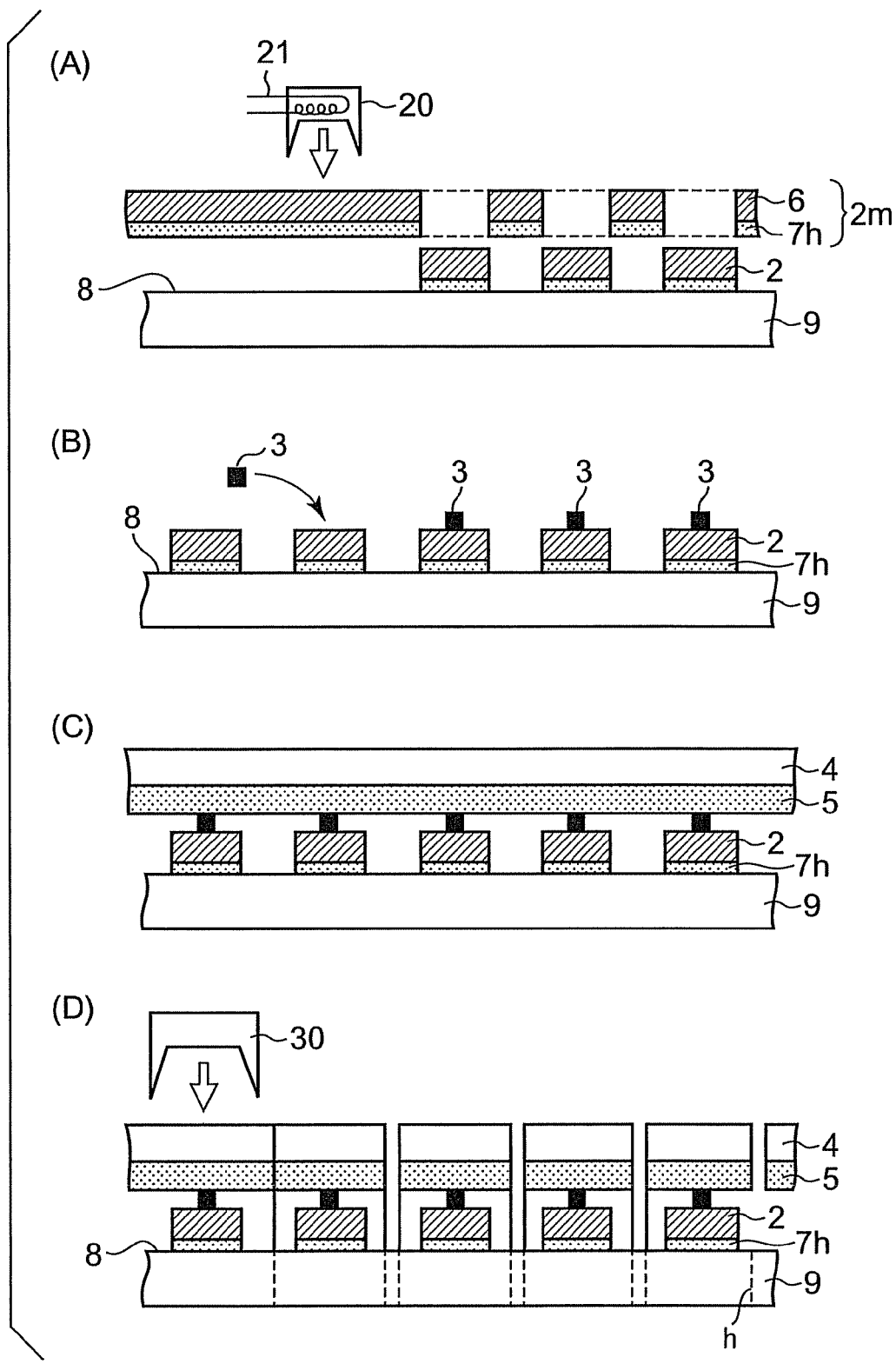
FIG. 3 is a diagram illustrating a first manufacturing process for the noncontact IC tag label.
Figure 4:
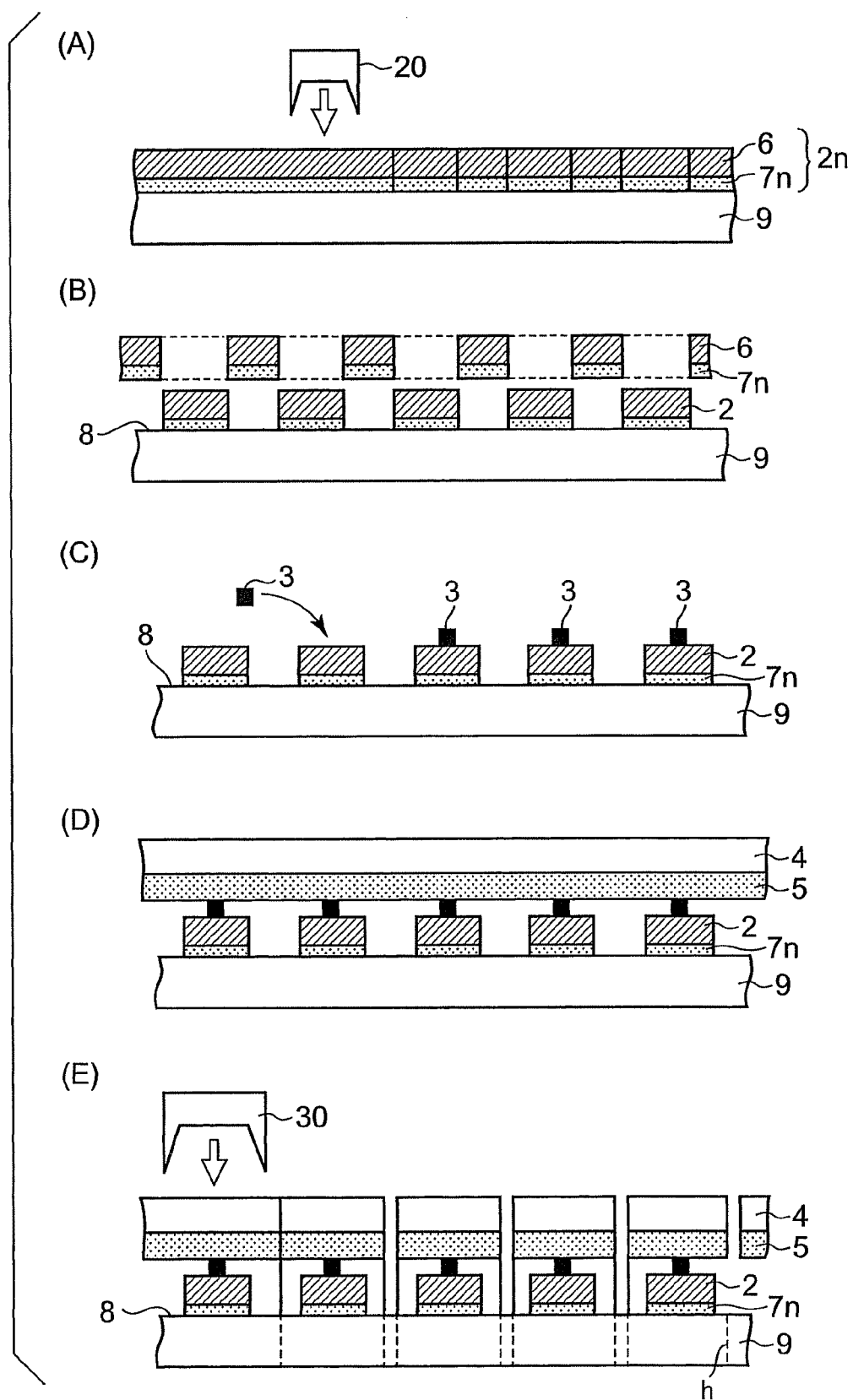
FIG. 4 is a diagram illustrating a second manufacturing process for the noncontact IC tag label.
Figure 5:
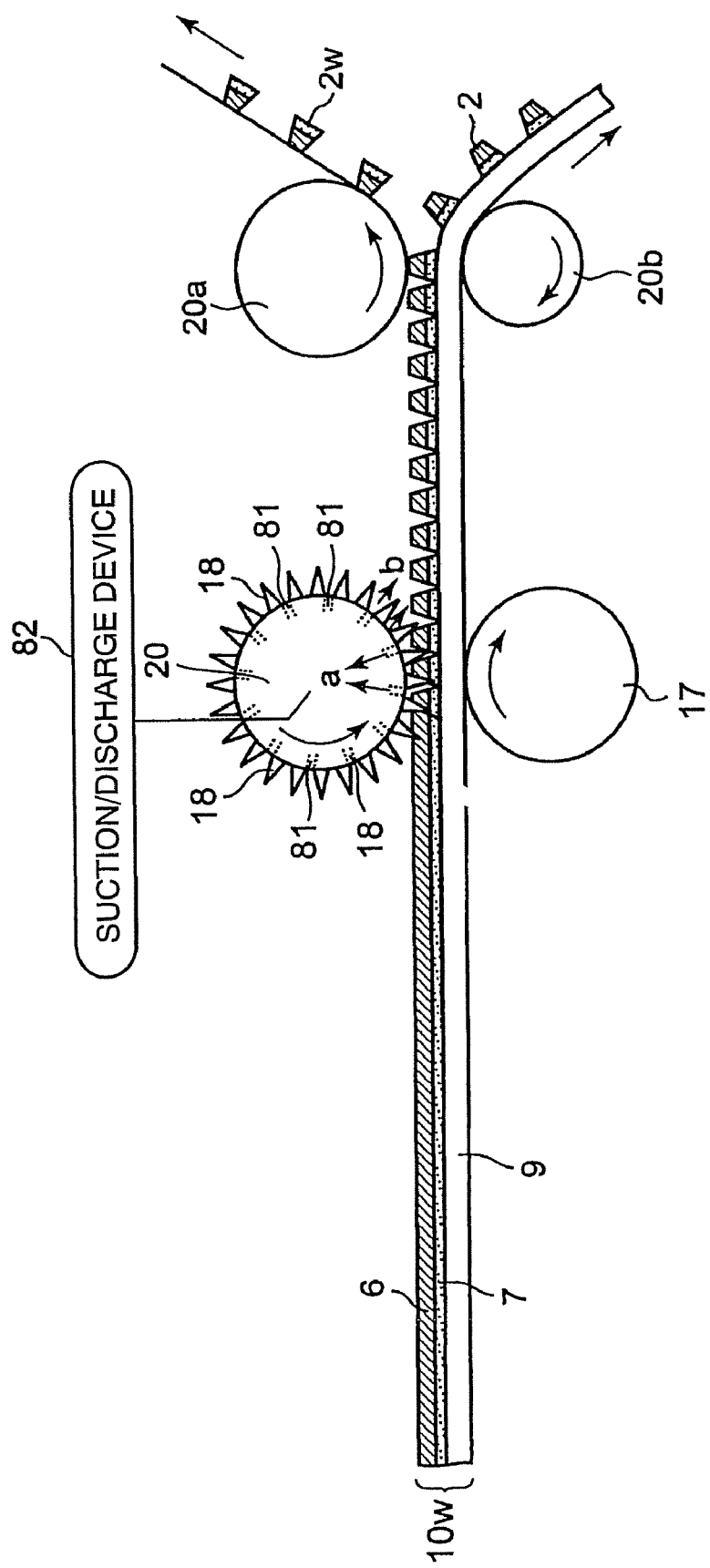
FIG. 5 is a diagram showing a structure of an antenna-punching apparatus.
Figure 6:
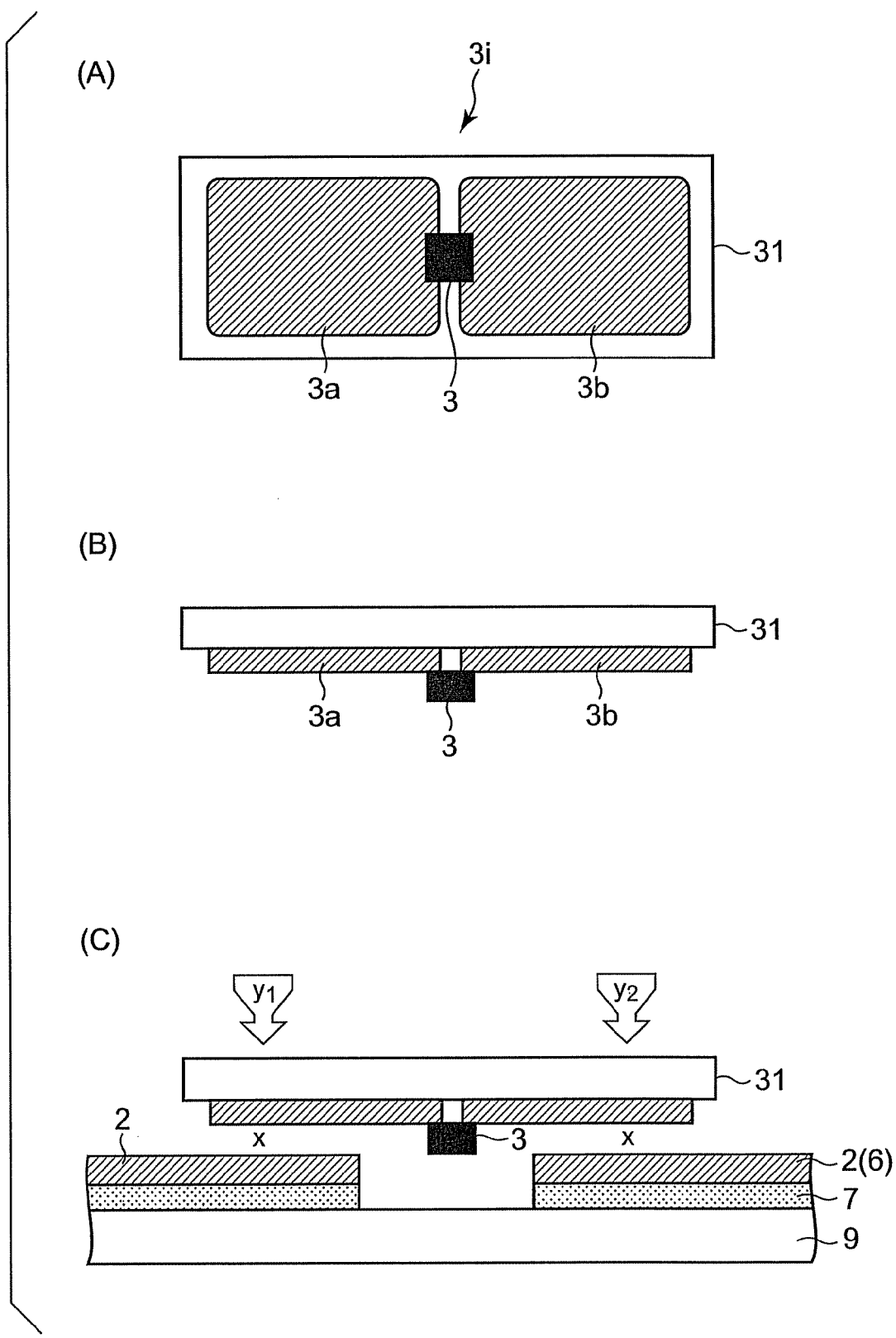
FIG. 6 is a diagram illustrating an example of an interposer.
Figure 7:
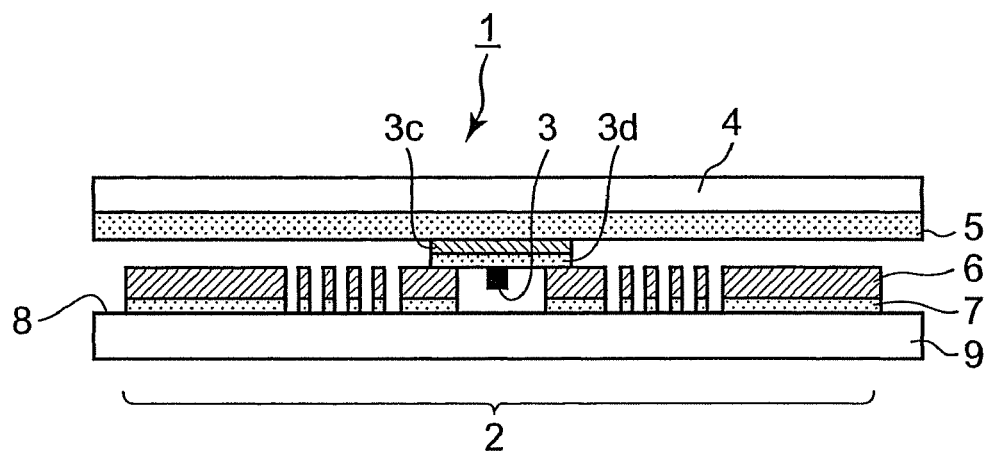
FIG. 7 is a diagram showing a modification of the noncontact IC tag label.
Figure 8:
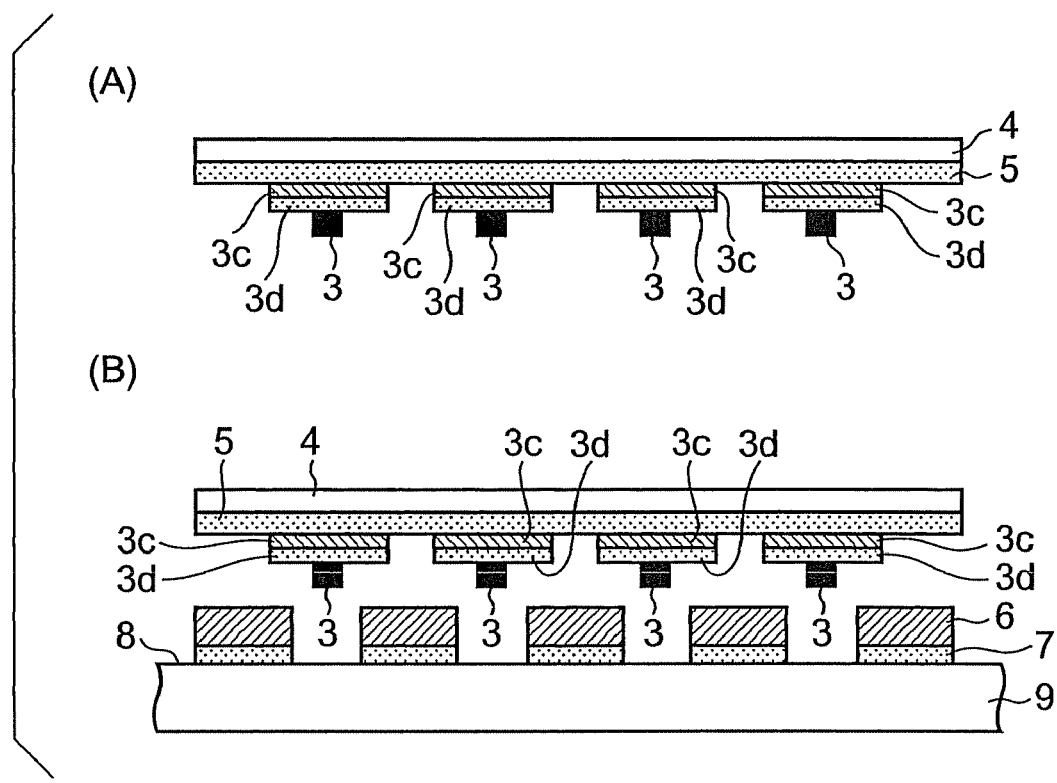
FIG. 8 is a diagram showing the step of connecting an electroconductive pattern layer to an upper face of an antenna pattern in a manufacturing process of the noncontact IC tag label shown in FIG. 7.
Figure 9:
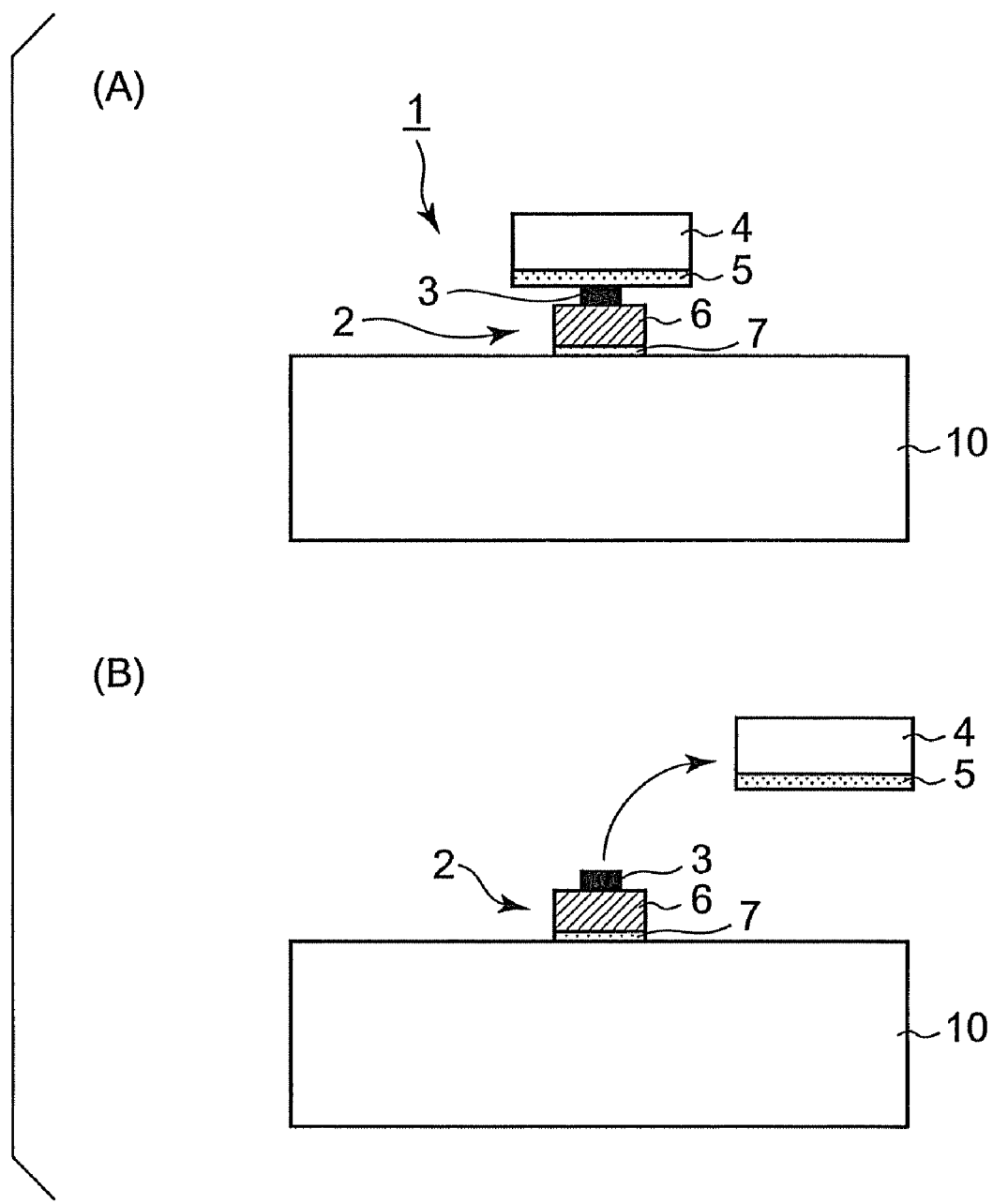
FIG. 9 is a diagram showing an action obtained when the noncontact IC tag label is detached from an object onto which the label has been attached.

FIG. 1 is a diagram showing a noncontact IC tag label of the present invention, FIG. 2 is a diagram illustrating a method of using the noncontact IC tag label, and FIG. 3 is a diagram illustrating a first manufacturing process for the noncontact IC tag label. In addition, FIG. 4 is a diagram illustrating a second manufacturing process for the noncontact IC tag label, FIG. 5 is a diagram showing a structure of an antenna-punching apparatus, and FIG. 6 is a diagram illustrating an example of an interposer. Furthermore, FIG. 7 is a diagram showing a modification of the noncontact IC tag label, FIG. 8 is a diagram showing the step of connecting an electroconductive pattern layer to an upper face of an antenna pattern in a manufacturing process of the noncontact IC tag label shown in FIG. 7, and FIG. 9 is a diagram showing an action obtained when the noncontact IC tag label is detached from an object onto which the label has been attached.

FIG. 1 is a diagram showing the noncontact IC tag label 1 of the present invention, with FIG. 1 (A) being a plan view of the IC tag label existing when an antenna 2 and an IC chip 3 are viewed through a surface protection sheet 4, and FIG. 1 (B) being a cross-sectional view of the label shown in FIG. 1 (A). As shown in FIG. 1 (A), for example, a dipole antenna 2 is formed on a back face of the surface protection sheet 4. The antenna 2 can take various shapes, including a spiral coil shape, a patch shape, etc. The spiral coil type of antenna that generates electromotive force by electromagnetic induction is usually used for a 13.56-MHz band.

The antenna 2, even when it is of the dipole type, does not need to have the bent shape shown in FIG. 1 (A), and can take a shape adapted to wavelengths of a UHF band or a 2.45-GHz band. In an actual product, the antenna 2 measures about 95 mm in end-to-end distance and about 1 mm in line width, and the IC chip 3 measures about 0.6 mm square.

The IC chip 3 is mounted (electrically connected) between connections 2a and 2b on quarter-wavelength antenna portions 2L and 2R. The IC chip 3 includes patterns 2c and 2d to stabilize its disposed state. These patterns are not connected to the IC chip and thus have no electrical significance or meaning. A rectangular circuit 2k surrounding the IC chip 3 is an impedance-matching circuit that matches the antenna 2 and the IC chip 3 in impedance.

The IC chip 3 is of a normal type including a data storage region (memory) and having input/output functions, control functions, and signal modulation, demodulation, and control functions. The IC chip 3 can be a single component as shown in FIG. 1, or can be mounted as an interposer component.

That is to say, when an interposer is used, the IC chip 3 may, as shown in FIG. 7, be mounted on one face of an electroconductive layer 6 (described later herein) via an electroconductive pattern 3c. In this case, a thermoplastic pressure-sensitive adhesive resin layer 3d formed from an electroconductive resin, for example, may be interposed between the electroconductive pattern 3c and the electroconductive layer 6.

FIG. 1 (B) is a cross-sectional view along a transverse central line of the IC chip 3 in FIG. 1. The IC chip 3 in this cross-sectional view is shown in dimensionally enlarged form in a thickness direction. Although the IC chip 3 actually presents at a slightly shifted position from the transverse central line, it is shown essentially thereupon. As shown in this cross-sectional view, the noncontact IC tag label 1 is constructed so that the antenna 2 and the IC chip 3 are supported on the back face (lower face) of the surface protection sheet 4 by being bonded onto a pressure-sensitive adhesive layer 5 (first pressure-sensitive adhesive layer). The pressure-sensitive adhesive layer 5 is formed on the entire lower face of the surface protection sheet 4. In the cross-sectional view, a clearance appears to be present between the pressure-sensitive adhesive layer 5 and the electroconductive layer 6, but actually, the two layers are in firm contact with each other. At sections without the electroconductive layer 6, a release surface 8 of a release paper 9 and the pressure-sensitive adhesive layer 5 are also in firm contact with each other. This state is also the same as in FIGS. 2, 3, and 4.

The antenna 2 is formed from the electroconductive layer 6, which has an adhesive resin layer 7 on a lower face thereof. Both layers are formed into substantially the same shape since, as described later herein, the antenna is formed by punching out the electroconductive layer 6 having the adhesive resin layer 7. The surface of the electroconductive layer 6 is in contact with the pressure-sensitive adhesive layer 5, and the adhesive resin layer 7 is temporarily bonded onto the release paper 9 formed from paper or a plastic base material. The adhesive resin layer 7 can use a thermo adhesive resin or a pressure-sensitive adhesive resin. The surface of the release paper 9 that faces the adhesive resin layer 7 is formed as the release surface 8. For example, when the base material of the release surface 8 is a film of paper-like quality or a resin film, the surface is coated with a silicone-containing resin. A resin film having a release property in an uncoated condition may be used.

The electroconductive layer 6 is made of a metallic foil or alloyed foil of aluminum, copper, a copper alloy, phosphor bronze, SUS, or the like. The adhesive resin layer 7 is also a material allowing the electroconductive layer 6 to be temporarily bonded onto the release surface 8 of the release paper 9, and is relatively easy to detach.

The surface protection sheet 4 shrouds an entire region of the noncontact IC tag 1, inclusive of the antenna 2 and the IC chip 3. A section between the surface protection sheet 4 and the release surface 8 of the release paper 9, and a region at which the antenna 2 is not interposed therebetween, is temporarily bonded directly onto the pressure-sensitive adhesive layer 5, as described above.

Suppose that peel strength between the surface protection sheet 4 and the pressure-sensitive adhesive layer 5 is defined as F1, peel strength between the pressure-sensitive adhesive layer 5 and the electroconductive layer 6, as F2, peel strength between the electroconductive layer 6 and the adhesive resin layer 7, as F3, peel strength between the release surface 8 and the pressure-sensitive adhesive layer 5, as F4, and peel strength between the release surface 8 and the adhesive resin layer 7, as F5. In this case, using the noncontact IC tag label requires that relationships of F1>F4, F2>F5, and F3>F5 be established. In the present invention, the release paper 9 is to be detached and only the surface protection sheet 4 integrated with the antenna 2 and the IC chip 3 is to be attached to an object. The above relationships naturally need to be established when the release paper 9 is detached. The adhesive resin layer 7 and the pressure-sensitive adhesive layer 5 can provide only weak peel strength with respect to the release surface 8 treated with silicone (or the like) for releasability, so the above relationships of force are usually met.

During the use of the noncontact IC tag label 1, the electroconductive layer 6 of the antenna 2 comes into direct contact with the desired object via the adhesive resin layer 7. The noncontact IC tag label 1 differs from a conventional noncontact IC tag label in that the presence of the base film for supporting the antenna 2 and IC chip 3, and the latter has resulted in the electroconductive layer 6 of the antenna 2 not coming into direct contact with the object to be labeled. During actual use, however, a contact area of the adhesive resin layer 7 of the antenna 2 with respect to the object to be labeled is small and a large portion of the adhesion to the object depends on the pressure-sensitive adhesive layer 5. The surface protection sheet 4 functions to inhibit oxidation of the antenna 2 and the IC chip 3 by preventing both from coming into direct contact with any potentially corrosive gases in an external environment, and to protect both from moisture and water.

In addition, during the use of the noncontact IC tag label 1, particularly when the object 10 to which the noncontact IC tag label 1 is to be attached is made of wood, paper, a metal, or a plastic, adhesive strength (peel strength) of the pressure-sensitive adhesive layer 5 is preferably weaker than that of the adhesive resin layer 7 with respect to the object 10. That is to say, when peel strength between the pressure-sensitive adhesive layer 5 and the object 10 is defined as F6, and peel strength between the adhesive resin layer 7 and the object 10, as F7, relationships of F1>F6, F3>F2, and F7>F2 are preferably established.

In this case, the noncontact IC tag label 1 fails if detached from the object 10 by force as shown in FIGS. 9 (A) and FIG. 9 (B). In other words, only the surface protection sheet 4 and the pressure-sensitive adhesive layer 5 peel off if the noncontact IC tag label 1 attached to the object 10 as shown in FIG. 9 (A) is detached by force. In contrast to this, the antenna 2 and the IC chip 3 remain on the object 10, as shown in FIG. 9 (B). Therefore, this prevents a counterfeit or a fake product from being feigned as if it is an authorized or authenticated one, even if this noncontact IC tag label 1 detached from the object 10 is attached to that.

Unlike conventional ones, the noncontact IC tag label 1 does not use a base film at the object side for supporting the antenna. Therefore, for example, if the object to be labeled is wet with water or when the object is made of a metal, the antenna 2 is prone to short-circuiting. However, any effects of the water can be reduced since the antenna 2 is shrouded by the pressure-sensitive adhesive layer 5 with the adhesive resin layer 7 interposed between the electroconductive layer 6 and the object to be labeled. Under an extremely water-wet condition, short-circuiting cannot be prevented, in which case, no kinds of noncontact TC tag labels become suitable for use. The same also applies when the object to be labeled is a metal.

The adhesive resin layer 7 uses a thermo adhesive resin or a pressure-sensitive adhesive agent. The thermo adhesive resin here is an adhesive agent with a so-called hot-melting property, and is a material that, although solid at normal temperature, exhibits adhesiveness when heated or pressurized under heat. When the adhesive resin is a pressure-sensitive adhesive agent, an acrylic adhesive agent, for example, is used. Additionally, the pressure-sensitive adhesive agent can have the same quality as that of the pressure-sensitive adhesive resin layer 5. The adhesive resin layer 7 of the antenna 2 is used for maintaining the temporarily bonded state between the antenna 2 and the release paper 9, and even when the release paper 9 is detached and then the noncontact IC tag label 1 is attached to an object, the adhesive resin layer preferably develops definite peel strength.

The electroconductive layer 6 of the antenna 2 usually uses an aluminum foil or a copper foil. Although a foil with a thickness from about 12 μm to about 35 μm is used for a 13.56-MHz band, a foil about 10 to 15 μm thick can be used for a UHF band or a microwave band. This is because, even when the foil is increased in thickness, the skin effect of high-frequency signals will prevent an electric current from flowing through the inside of the metallic layer.

FIG. 2 is a diagram illustrating a method of using the noncontact IC tag label 1. When the noncontact IC tag label 1 is used, the release paper 9 is first detached from the temporarily bonded antenna 2 and IC chip 3 on the release surface 8, as shown in FIG. 2 (A), and then the label is attached to its intended object 10. An actual area that the electroconductive layer 6 of the antenna 2 occupies is small. Unlike the state shown in FIG. 2 (A), therefore, a large portion of the noncontact IC tag label 1 is bonded onto the object 10 by the pressure-sensitive adhesive layer 5 of the surface protection sheet 4. Under the attached state of the label, oxidation and the effects of exposure to moisture and water can be avoided since the surface protection sheet 4 shrouds the entire antenna 2 and IC chip 3 as shown in FIG. 2 (B).

Next, manufacturing processes relating to the noncontact IC tag label of the present invention will be described. A first manufacturing process applies to a case where a thermo adhesive resin is used as the material of the adhesive resin layer 7, and a second manufacturing process applies to a case where a pressure-sensitive adhesive is used as the material of the adhesive resin layer 7.

FIG. 3 is a diagram illustrating the first manufacturing process for the noncontact IC tag label.

In the first manufacturing process, a band-shaped antenna material 2m formed by an electroconductive layer 6 and a thermo adhesive resin layer 7h, and a continuous release paper 9 formed from paper or a plastic base material are first supplied in overlapped form to manufacturing line so that the thermo adhesive resin layer 7h comes into close contact with a release surface 8 of the release paper 9. The close contact here means a state in which the antenna material 2m and the release paper 9 are in contact with the release surface 8 but are not bonded thereonto. Next as shown in FIG. 3 (A), the electroconductive layer 6 and thermo adhesive resin layer 7h of the antenna material 2m are die-cut into a shape of an antenna pattern at fixed intervals from a side the electroconductive layer 6 is disposed by use of an antenna-cutting die 20 having a heat source 21. The heat source 21 of the antenna-cutting die 20 fuses the thermo adhesive resin layer 7h simultaneously with the above cutting-out operation and temporarily bonds an antenna 2 onto the release surface 8 of the release paper 9. Sections other than the antenna pattern of the die-cut antenna material 2m are in a continuous state and the continuous sections are removed using a separating roll (not shown) that is positioned at a post-processing stage.

The antenna 2, although shown symbolically in block form in FIG. 3, has a further detailed structure as shown in FIG. 1. Die-cutting into a shape of an antenna pattern can use a planar flat-bed cutting die or can use a cutting die having a rotary cylinder surface.

Next as shown in FIG. 3 (B), an IC chip 3 is mounted at a required position on the antenna 2. When the antenna 2 is of the dipole type, the IC chip 3 is mounted between left and right quarter-wavelength antenna portions 2L and 2R. When the antenna 2 is of a planar coil shape, the IC chip 3 is mounted across the coil-shaped antenna. The IC chip 3 may be directly mounted as an independent component, or may be mounted as an interposer component. For independent mounting, after a pad or bump of the IC chip and the antenna have been brought into firm contact with each other, periphery of the IC chip is fixed in that state by using an anisotropic electroconductive paste, a tape, a non-electroconductive paste, or the like. Reliable connection can be established by using a stud-bumped chip as the IC chip 3 and inserting the bump into a metallic portion of the antenna 2 before fixing the periphery. For mounting as an interposer component, connection may use an electroconductive adhesive agent, a staking tool, or an ultrasonic connecting method in which metals of both the interposer and the antenna are to be molten for bonding.

Next as shown in FIG. 3 (C), a pressure-sensitive adhesive agent is used to stack a surface protection sheet 4 upon the antenna 2, the IC chip 3, and the release surface 8. The pressure-sensitive adhesive agent is of a type capable of maintaining an intermediate tacky state in which the adhesive agent can be used permanently without rapid, significant increases in viscosity. The antenna 2 on the surface of the release paper 9 is formed from a thin metallic foil, so although temporarily bonded by a thermo adhesive resin layer 7h, the antenna 2 tends to be easily separated. When the surface protection sheet 4 is stacked, a pressure-sensitive adhesive layer 5 thereof stabilizes the antenna 2 by immobilizing it strongly. When the label is attached to its intended object, the pressure-sensitive adhesive layer 5 also functions to hold the antenna 2 and the IC chip 3 integrally and stably.

When an electroconductive pattern layer 3c is interposed between the IC chip 3 and the electroconductive layer 6, the steps in FIGS. 3 (B) and FIG. 3 (C), that is, mounting the IC chip 3 on the antenna 2 and then stacking the surface protection sheet 4 on the IC chip 3 may be conducted in the following way. That is to say, first as shown in FIGS. 8 (A) and FIG. 8 (B), the electroconductive pattern layer 3c, on which the IC chip 3 is mounted in advance, formed on the surface protection sheet 4 via a first pressure-sensitive adhesive layer 5 is set up into position. This state is shown in FIG. 8 (A). Next, the electroconductive pattern layer 3c is connected to the surface of the antenna pattern. In the connection, the electroconductive pattern layer 3c is attached to the antenna pattern via a thermoplastic pressure-sensitive adhesive resin layer 3d formed upon the electroconductive pattern layer 3c. After that, as shown in FIG. 8 (B), the electroconductive pattern layer 3c and the antenna pattern are interconnected using a thermal staking method, an ultrasonic connecting method, a thermocompression bonding method, or a stapler fastening method independently or in combination.

After the interconnection, the surface protection sheet 4 around the antenna 2 is die-cut into an outline shape of the noncontact IC tag label 1 by use of a label-cutting die 30, as shown in FIG. 3 (D). This step is performed to make the sheet 4 easily cuttable from adjacent labels, and to remove a base material present around the label. For punching of the noncontact IC tag label 1 into a unit label shape, it is punched until lower ends of the die penetrates the release paper 9 formed from paper or a plastic base material, as denoted by a broken line "h" in FIG. 3 (D). For cutting of the noncontact IC tag label 1 into a band-shaped continuum, the noncontact IC tag label is die-cut to a depth at which the cutting die reaches the release surface 8 of the release paper 9. This latter cutting operation involves removing unnecessary materials continuously from the periphery of the label.

FIG. 4 is a diagram illustrating a second manufacturing process for the noncontact IC tag label. The second manufacturing process applies when a pressure-sensitive adhesive agent is used for the adhesive resin layer 7. First, a band-shaped antenna material 2n including an electroconductive layer 6 and a pressure-sensitive adhesive layer 7n (second pressure-sensitive adhesive layer), and a continuum of a release paper 9 having a release surface 8 and formed from paper or a plastic base material are overlapped, and then the pressure-sensitive adhesive layer 7n is brought into contact with and pressed against the release surface 8. Since the pressure-sensitive adhesive layer 7n has adhesion to the release surface 8, bonding is possible just by applying pressure. Substantially the same result can also be obtained by, while coating the electroconductive layer 6 with a pressure-sensitive adhesive agent, laminating the paper-formed or plastic-based release paper 9 having the release surface 8.

Next as shown in FIG. 4 (A), the electroconductive layer 6 and pressure-sensitive adhesive layer 7n of the antenna material 2n are die-cut into an antenna pattern at fixed intervals from a side the electroconductive layer 6 is disposed by use of an antenna-cutting die 20. In this case, unlike the case of using a thermo adhesive resin, the cutting die 20 does not require a heat source. Sections other than the antenna pattern of the die-cut antenna material 2n are in a continuous state, and as shown in FIG. 4 (B), these sections are removed using a separating roll (not shown). As shown in FIG. 4 (B), die-cutting of the antenna can likewise be performed by using a planar flat-bed cutting die or a cutting die having a rotary cylinder surface.

Next, an IC chip 3 or an interposer is mounted at a required position on the antenna 2, as shown in FIG. 4 (C). The mounting method is the same as for the first manufacturing process.

As shown in FIG. 4 (D), a surface protection sheet 4 is stacked upon the antenna 2, the IC chip 3, and the release surface 8, by use of a pressure-sensitive adhesive. Finally as shown in FIG. 4 (E), the surface protection sheet 4 around the antenna 2 is die-cut into an outline shape of the noncontact IC tag label 1 by use of a label-cutting die 30.

When an electroconductive pattern layer 3c is interposed between the IC chip 3 and the electroconductive layer 6, the IC chip 3 can likewise be mounted on the antenna 2 by using substantially the same method as that shown in FIGS. 8 (A) and FIG. 8 (B) for the first manufacturing process. That is to say, the electroconductive pattern layer 3c, on which the IC chip 3 is mounted in advance, formed on the surface protection sheet 4 via a first pressure-sensitive adhesive layer 5 may be connected to the surface of the antenna pattern.

For punching of the noncontact IC tag label 1 into a unit label shape, the IC tag label 1 is punched until lower ends of the die penetrates the release paper 9, as denoted by a broken line "h" in FIG. 4 (E). For cutting of the noncontact IC tag label 1 into a band-shaped continuum, the IC tag label 1 is die-cut to a depth at which the cutting die reaches the release surface 8 of the release paper 9. This latter cutting operation involves removing peripheral sections of the label continuously. This step is the same as that of the first manufacturing process.

A supplementary description of the above manufacturing method is given below. In the above manufacturing method, the antenna 2 is formed by die-cutting the electroconductive layer 6 including a metallic foil via the thermo adhesive resin layer 7h or the pressure-sensitive adhesive layer 7n on the release surface 8 of the release paper 9. During the formation of the antenna, however, the die-cut antenna portion may not be smoothly separable from a section other than the antenna 2. If both sections become intertwined and entangled during the separation, electrical disconnection of the antenna will result. This tendency will be more significant as the antenna has a larger number of thin linear portions. Accordingly, a die-cutting cylinder of the following structure is preferably used.

FIG. 5 is a structural view of an antenna-punching apparatus. The die-cutting cylinder 20 is a metallic roller with die-cutting teeth 18 being formed upon its peripheral face to fit the pattern of the antenna 2. The die-cutting teeth 18 for die-cutting the pattern of one antenna 2 are arranged in a plurality of sets around the cutting cylinder 20. The number of sets arranged, however, differs according to particular outline dimensions of the antenna and a particular diameter of the cutting cylinder. In addition, a receiving roller 17 is constructed of a metallic roller and a hard rubber roller. A gap between the receiving roller 17 and the cutting cylinder 20 can be adjusted to thickness of elements such as the release paper 9 and the metallic foil electroconductive layer 6 by, for example, changing the roller 17 in position. The cutting cylinder 20 can be a sculpturing roller, a rotary die, or the like.

The continuum 10w including the release paper 9 and the electroconductive layer 6 (including the adhesive resin layer 7) is pulled in between the cutting cylinder 20 and the receiving roller 17, and then the pattern of the antenna 2 is die-cut from above the electroconductive layer 6 by the die-cutting teeth 18. The die-cutting teeth 18 of the cutting cylinder 20 cut a portion of the electroconductive layer 6 and thermo adhesive resin layer 7h or pressure-sensitive adhesive layer 7n, thus forming the antenna 2 easily and accurately. Thickness of the cutting teeth 18 is preadjusted to avoid cutting the layers of the release paper 9.

In addition, such pattern cuts as shown in FIG. 1 are formed along a profile of the antenna 2 (i.e., outer edges at both sides of the antenna line) on the continuum 10w including the release paper 9 and the electroconductive layer 6, by distal ends of the die-cutting teeth 18 which penetrate the continuum of the metallic foil electroconductive layer 6. Thus, the electroconductive layer 6 is accurately die-cut in accordance with the pattern of the antenna 2, truing up the profile of the antenna patter properly.

Furthermore, an air hole 81 is formed between the individual die-cutting teeth 18 on an outer peripheral surface of the cutting cylinder 20 (the air hole corresponding to each unnecessary section of the electroconductive layer 6). These air holes 81 are each connected to a suction/discharge device 82. The suction/discharge device 82 is precisely controlled such that in order to cut the continuum 10w by the die-cutting teeth 18, the device 82 temporarily suctions unnecessary sections of the continuum 10w including the electroconductive layer 6 and adhesive resin 7 by drawing in air towards the cutting die (in a direction of an arrow "a") via the air holes 81, then after the die cutting of the continuum 10w and very slight rotation of the cutting cylinder 20 through a required angle, blows the air out in a direction of an arrow "b" via the air holes 81 and discharges the temporarily suctioned unnecessary sections towards the continuum 10w including the release paper 9.

Thus, the electroconductive layer 6 and thermo adhesive resin layer 7h or pressure-sensitive adhesive layer 7n is die-cut into the required pattern shape more reliably. In addition, reconnection between an unnecessary section and a necessary one after die cutting can be avoided and the unnecessary sections of the continuum 10w can be recovered easily. Furthermore, the unnecessary portions can be prevented from becoming congested between adjacent die-cutting teeth 18 on the outer peripheral surface of the cutting cylinder 20. The air holes 81 may be selectably connected to an air suction mechanism and discharge mechanism of the suction/discharge device 82, or air holes for connection to the suction mechanism may be provided independently of air holes for connection to the discharge mechanism. When the adhesive resin layer 7 is the pressure-sensitive adhesive layer 7n and the pressure-sensitive adhesive agent strongly adheres to the release paper layer 9, separating of unnecessary sections from necessary ones is difficult. For this reason, a easily detachable pressure-sensitive adhesive agent is selectively used. For persons skilled in the art, it is self-evident that in flat-bed die cutting, although this is not shown, unnecessary sections can be easily removed by providing air holes similarly to the above and leaving the necessary sections of the die-cut antenna 2 intact on the release paper 9.

At a downstream side relative to the cutting cylinder 20, the antenna-punching apparatus has separating rollers 20a and 20b above and below the continuum 10w. Upon a passage of a portion of the continuum 10w between the separating rollers 20a, 20b, the necessary section and unnecessary section of the continuum are pulled in different directions. The antenna 2 supported upon the surface of the release paper 9 travels in this state in an arrow-marked direction (downward in FIG. 5), and the unnecessary section 2w that has been die-cut by the cutting cylinder 20 travels in a different arrow-marked direction (upward in FIG. 5) while being completely separated from the continuum 10w. After that, the IC chip 3 and other necessary members are mounted on the antenna 2, and the surface protection sheet 4 is laminated. The section of the electroconductive layer 6 that serves as the antenna 2 has a very small area, so actually the unnecessary section 2w is removed as a continuum having a larger area.

FIG. 6 is a diagram illustrating an example of an interposer. FIG. 6 (A) is a plan view of the interposer, FIG. 6 (B) is a cross-sectional view, and FIG. 6 (C) is a layout view of the interposer as mounted on the antenna 2.

The interposer 3i includes metallic-foil electroconductive layer-based connection terminals 3a and 3b (electroconductive pattern layer 3c) formed upon, for example, a base material 31 (surface protection sheet 4) with an IC chip 3 mounted between the connection terminals 3a, 3b. The IC chip 3 is electrically connected at its bump to the connection terminals 3a, 3b via an electroconductive adhesive agent or the like, as shown in FIG. 6 (B). Actual base-material width of the interposer 3i is about two to three millimeters and length thereof is about several millimeters. However, the interposer, unlike that shown in FIG. 6, is variable in shape and dimensions partly because the interposer may also be of a bridge structure with a connection across the antenna line. For mounting of the interposer 3i on the antenna 2, both are interconnected at sections marked "x" in FIG. 6 (C), by bringing the connection terminals 3a, 3b into contact with the antenna 2 and then forcibly inserting the interposer 3i from an opposite side of a face, on which the connection terminals 3a and 3b are mounted, of the base material 31 (refer to a direction of arrows y1 and y2) using a staking edge. Such a technique is also described on JP-A-2006-107418, an earlier application of the applicant. Ultrasonic mounting may be adopted as an alternative method.

After the mounting of the IC chip 3, the surface protection sheet 4 is stacked by bonding, as shown in FIG. 3 (C). The surface protection sheet 4 can be any kind of waterproof plastic film, paper, or the like. More specifically, the sheet material can be either of the following: polyethylene terephthalate (PET), PET-G (terephthalic acid-cyclohexanedimethanol-ethylene glycol copolymer), polyvinyl chloride, vinyl chloride-vinyl acetate copolymer, polycarbonate, polyamide, polyimide, cellulose diacetate, cellulose triacetate, polystyrene-based, ABS, ester polyacrylate, polypropylene, polyethylene, polyurethane, resin-impregnated paper, coated paper, etc.

Heat-sensitive paper can be used alternatively. Heat-sensitive paper includes a color-developing agent, which allows simplified printing of necessary label-marking information on the noncontact IC tag label 1 by a thermal head. Traditionally, a method of forming an antenna directly on labeling paper has been adopted, but the use of heat-sensitive paper as the labeling paper has posed the problem that the energy occurring during the formation of the antenna causes the heat-sensitive paper to develop colors. The present invention, however, has an advantage in that since an antenna is formed at the release paper (separator) side, the use of heat-sensitive paper on the surface of the release paper having the antenna formed thereupon does not easily cause fouling.

The embodiments described below can be used in specific applications, even when the surface protection sheet 4 is also coated with an adhesive layer including a heat-sensitive adhesive resin layer. Given a material of the same quality as that of the thermo adhesive resin layer 7h of the antenna 2, the label can be attached to the object 10 by fusion compression under the same conditions.

(Embodiments Relating to the Kinds of Materials)

(1) Adhesive Agent and Pressure-sensitive Adhesive Agent

The terms "adhesives" or "adhesive agents" used in the present DESCRIPTION refer to solvent types, polymer types, ultraviolet-radiation curing types, emulsion types, heat-melting type, or various other types, inclusive of so-called pressure-sensitive adhesive agent types. This is because any one of these types of adhesive agents makes the intended purpose of the adhesive agent attainable just by bonding both the label material and its intended object material. In addition, the terms "pressure-sensitive adhesives" or "pressure-sensitive adhesive agents" used in the present DESCRIPTION refer to types including the type that permanently maintains an intermediate ever-tacky state of the adhesive agent without gradual, significant increases in viscosity. Resin compositions of the above adhesives and pressure-sensitive adhesives can include various kinds of materials such as those based upon natural rubber, nitrile rubber, epoxy resin, vinyl acetate emulsion, polyester, acryl, ester acrylate copolymer, polyvinyl alcohol, and phenol resin.

(2) Release Paper

A material whose base material is coated with a chemical (usually, silicone) of a low contact angle to achieve low peel strength is used for a release paper. High-quality paper, kraft paper, glassine paper, parchment paper, super-calendered paper, or the like is used as a release paper base material. The release paper is usually provided with direct silicone coating or with silicone coating after either polyethylene coating or clay binder coating. PET, OPP (biaxially stretched polypropylene), or PE is also used directly intact or in silicone-coated form as a release paper base material.

FIRST EXAMPLE

An aluminum foil having 120 mm wide by 15 μm thick, coated with a polyester-based hot-melting adhesive agent (thermo adhesive resin layer 7h) to a thickness of 20 μm, is used as a continuum of an antenna material 2m. Kraft paper surface-coated with silicone to a width of 120 mm and a thickness of 100 μm is used as a release paper 9. The antenna material 2m is overlaid upon the release paper 9 so as to face upward, and then supplied to a test-produced flat-bed antenna-cutting die 20 containing a heat source. A dipole antenna 2 of the shape as shown in FIG. 1 is continuously die-cut at 50-mm intervals. The cutting die 20 is a device having the foregoing air holes 81 and constructed to connect to a suction/discharge device 82. The heat source is also inserted within a receiving die side of the cutting die so that the thermo adhesive resin layer 7h is fully heated and fused.

After a portion of the continuum 10w of the die-cut antenna material 2m is moved past between separating rollers 20a and 20b, a necessary section of the antenna 2 is then separated from an unnecessary section smoothly to obtain a precise antenna pattern shape in a thermally transferred condition on the surface of the release paper 9. A UHS-band IC chip 3 ("Monza", manufactured by Impinj, Inc., USA) is mounted between connections 2a and 2b on antenna portions 2L and 2R by use of an anisotropic electroconductive adhesive agent. After this, upper faces of the antenna 2 and IC chip 3 are laminated with a PET film having 120 mm wide and 20 μm thick, via a pressure-sensitive adhesive layer 5 with a thickness of 30 μm. A surface protection sheet 4 is thus obtained. Finally, the continuum 10w is punched penetrating the release paper 9 to obtain noncontact IC tag labels 1 of the present invention, each of the noncontact IC tag labels having 40 mm wide and 100 mm thick, by use of a label-cutting die 30.

SECOND EXAMPLE

An aluminum foil having 120 mm wide by 15 μm thick, including an adhesive resin layer 7 coated with an acrylic pressure-sensitive adhesive agent 7n to a thickness of 25 μm, is used as a continuum of an antenna material 2m. Kraft paper surface-coated with silicone to a width of 120 mm and a thickness of 80 μm is used as a release paper 9. The antenna material 2m is overlaid upon the release paper 9 so as to face upward, and then supplied to the flat-bed antenna-cutting die 20 used in the first example. However, the present (second) example does not use a heat source.

A dipole antenna 2 of the shape as shown in FIG. 1 is continuously die-cut at 50-mm intervals. After a portion of the continuum 10w of the die-cut antenna material 2m is moved past between separating rollers 20a and 20b, then a necessary section of the antenna 2 is separated from an unnecessary section, and a precise antenna pattern shape is obtained in a thermally transferred condition on the surface of the release paper 9. As shown in FIG. 6, a UHS-band IC chip 3 ("Monza", manufactured by Impinj, Inc., USA) is mounted in interposer form between connections 2a and 2b on antenna portions 2L and 2R by use of a staking tool.

After that, upper faces of the antenna 2 and IC chip 3 are laminated with 120-mm wide, black-color developing heat-sensitive paper (manufactured by Ricoh Co., Ltd.) via a 30-μm thick pressure-sensitive adhesive layer 5. Thus, a surface protection sheet 4 is obtained. Finally, the continuum 10w is die-cut down to the surface of the release paper 9 (i.e., the release surface 8) by use of a label-cutting die 30 to obtain IC tag labels. A continuum of noncontact IC tag labels 1 of the present invention is thus completed.

The noncontact IC tag labels 1 in the first and second examples were tested using a UHF-band label reader/writer to confirm that normal reading/writing is achievable. It is also confirmed that the noncontact IC tag label 1 in the second example allows recording on the surface protection sheet 4 by a thermal head.

The invention claimed is:

1. A noncontact IC tag label, comprising:
   an electroconductive layer having a required antenna pattern shape;
   an IC chip mounted on one face of the electroconductive layer;
   a surface protection sheet supporting the electroconductive layer and the IC chip from one face side of the electroconductive layer, via a first pressure-sensitive adhesive layer; and
   an adhesive resin layer provided on the other face of the electroconductive layer, the adhesive resin layer being of the same shape as the antenna pattern shape of the electroconductive layer;
   wherein the adhesive resin layer is temporarily bonded in a separable manner onto a release paper formed from paper or a plastic base material, and
   wherein a pressure-sensitive adhesive strength of the first pressure-sensitive adhesive layer is weaker than a pressure-sensitive adhesive strength of the adhesive resin layer with respect to an object onto which the noncontact IC tag label is to be bonded.

2. The noncontact IC tag label according to claim 1, wherein the adhesive resin layer includes a thereto adhesive resin layer or a second pressure-sensitive adhesive layer.

3. The noncontact IC tag label according to claim 2, wherein the surface protection sheet is formed from heat-sensitive color-developing paper.

4. The noncontact IC tag label according to claim 1, wherein the surface protection sheet is formed from heat-sensitive color-developing paper.

5. The noncontact IC tag label according to claim 1, wherein the antenna pattern shape is either a spiral coil type, a dipole type, or a patch type.

6. The noncontact IC tag label according to claim 1, wherein the object is formed from wood, paper, a metal, or a plastic.

7. The noncontact IC tag label according to claim 1, wherein the IC chip is mounted on the one face side of the electroconductive layer via an electroconductive pattern layer.

8. A method for manufacturing a noncontact IC tag label, the method comprising the steps of:
   setting up into position a release paper formed from paper or a plastic base material, the release paper having a release surface;
   bringing an antenna material inclusive of an electroconductive layer and a thermo adhesive resin layer into firm contact with the release surface of the release paper with the thermo adhesive resin layer oriented towards the release surface;
   temporarily bonding the electroconductive layer and thermo adhesive resin layer of the antenna material onto the release surface by firstly die-cutting the electroconductive layer and the thermo adhesive resin layer into a shape of an antenna pattern, from a side the electroconductive layer is disposed down to the release surface, by use of an antenna-cutting die having a heat source, and then fusing the thermo adhesive resin layer;
   removing sections other than the antenna pattern of the die-cut antenna material;
   mounting an IC chip at a required position on the antenna pattern;
   stacking a surface protection sheet over the IC chip via a first pressure-sensitive adhesive layer; and
   die-cutting the surface protection sheet and the first pressure-sensitive adhesive layer into an outline shape of the noncontact IC tag label by use of a label-cutting die.

9. The method of manufacturing a noncontact IC tag label according to claim 8, wherein the shape of the antenna pattern is either a spiral type, a dipole type, or a patch type.

10. The method of manufacturing a noncontact IC tag label according to claim 8, wherein a pressure-sensitive adhesive strength of the first pressure-sensitive adhesive layer is weaker than a pressure-sensitive adhesive strength of the thermo adhesive resin layer with respect to an object onto which the noncontact IC tag label is to be bonded.

11. A method for manufacturing a noncontact IC tag label, the method comprising the steps of:
    setting up into position a release paper formed from paper or a plastic base material, the release paper having a release surface;
    bonding an antenna material inclusive of an electroconductive layer and a second pressure-sensitive adhesive layer onto the release surface of the release paper with the second pressure-sensitive adhesive layer oriented towards the release surface;
    die-cutting the electroconductive layer and second pressure-sensitive adhesive layer of the antenna material into a shape of an antenna pattern, from a side the electroconductive layer is disposed down to the release surface, by use of an antenna-cutting die;
    removing sections other than the antenna pattern of the die-cut antenna material;
    mounting an IC chip at a required position on the antenna pattern;
    stacking a surface protection sheet over the IC chip via a first pressure-sensitive adhesive layer; and
    die-cutting the surface protection sheet and the first pressure-sensitive adhesive layer into an outline shape of the noncontact IC tag label by use of a label-cutting die.

12. The method of manufacturing a noncontact IC tag label according to claim 11, wherein a pressure-sensitive adhesive strength of the first pressure-sensitive adhesive layer is weaker than a pressure-sensitive adhesive strength of the second pressure-sensitive adhesive layer with respect to an object onto which the noncontact IC tag label is to be bonded.

13. The method of manufacturing a noncontact IC tag label according to claim 11, wherein the shape of the antenna pattern is either a spiral type, a dipole type, or a patch type.

14. A method for manufacturing a noncontact IC tag label, the method comprising the steps of:
    setting up into position a release paper formed from paper or a plastic base material, the release paper having a release surface;
    bringing an antenna material inclusive of an electroconductive layer and a thermo adhesive resin layer into firm contact with the release surface of the release paper with the thermo adhesive resin layer oriented towards the release surface;
    temporarily bonding the electroconductive layer and thermo adhesive resin layer of the antenna material onto the release surface, by firstly die-cutting the electroconductive layer and the thermo adhesive resin layer into a shape of an antenna pattern, from a side the electroconductive layer is disposed down to the release surface, by use of an antenna-cutting die having a heat source, and then fusing the thermo adhesive resin layer;

removing sections other than the antenna pattern of the die-cut antenna material;

connecting an electroconductive layer including an IC chip previously mounted thereon and formed upon a surface protection sheet via a first pressure-sensitive adhesive layer, to an upper face of the antenna pattern; and die-cutting the surface protection sheet and the first pressure-sensitive adhesive layer into an outline shape of the noncontact IC tag label by use of a label-cutting die.

15. The method of manufacturing a noncontact IC tag label according to claim 14, wherein a thermoplastic pressure-sensitive adhesive resin layer is provided on the electroconductive layer, and the step of connecting the electroconductive pattern layer to the upper face of the antenna pattern includes the substeps of:

attaching the electroconductive pattern layer to the upper face of the antenna pattern via the thermoplastic pressure-sensitive adhesive resin layer; and interconnecting the electroconductive pattern layer and the antenna pattern by using a thermal staking method, an ultrasonic connecting method, a thermocompression bonding method, or a stapler fastening method independently or in combination.

16. A method for manufacturing a noncontact IC tag label, the method comprising the steps of:

setting up into position a release paper formed from paper or a plastic base material, the release paper having a release surface;

bonding an antenna material inclusive of an electroconductive layer and a second pressure-sensitive adhesive layer onto the release surface of the release paper with the second pressure-sensitive adhesive layer oriented towards the release surface;

die-cutting the electroconductive layer and second pressure-sensitive adhesive layer of the antenna material into a shape of an antenna pattern, from a side the electroconductive layer is disposed down to the release surface, by use of an antenna-cutting die;

removing sections other than the antenna pattern of the die-cut antenna material;

connecting an electroconductive pattern layer including an IC chip previously mounted thereon and formed upon a surface protection sheet via a first pressure-sensitive adhesive layer, to an upper face of the antenna pattern; and die-cutting the surface protection sheet and the first pressure-sensitive adhesive layer into an outline shape of the noncontact IC tag label by use of a label-cutting die.

17. The method of manufacturing a noncontact IC tag label according to claim 16, wherein a thermoplastic pressure-sensitive adhesive resin layer is provided on the electroconductive layer, and the step of connecting the electroconductive pattern layer to the upper face of the antenna pattern includes the substeps of:

attaching the electroconductive pattern layer to the upper face of the antenna pattern via the thermoplastic pressure-sensitive adhesive resin layer; and interconnecting the electroconductive pattern layer and the antenna pattern by using a thermal staking method, an ultrasonic connecting method, a thermocompression bonding method, or a stapler fastening method independently or in combination.

* * * * *